United States Patent [19]

Wakefield et al.

[11] Patent Number: 5,073,816
[45] Date of Patent: Dec. 17, 1991

[54] PACKAGING SEMICONDUCTOR CHIPS

[75] Inventors: Elwyn P. M. Wakefield, Coombe Dingle; Christopher P. H. Walker, Portishead, both of United Kingdom

[73] Assignee: Inmos Limited, United Kingdom

[21] Appl. No.: 557,940

[22] Filed: Jul. 25, 1990

[30] Foreign Application Priority Data

Aug. 14, 1989 [GB] United Kingdom ............... 8918482

[51] Int. Cl.$^5$ ..................... H01L 23/06; H01L 23/14
[52] U.S. Cl. ......................................... 357/74; 357/75
[58] Field of Search .............................. 357/80, 75, 74

[56] References Cited

U.S. PATENT DOCUMENTS

| | | | |
|---|---|---|---|
| 3,684,818 | 8/1972 | Netherwood | 357/75 |
| 4,721,995 | 1/1988 | Tanizawa | 357/75 |
| 4,868,638 | 9/1989 | Hirata et al. | 357/74 |
| 4,890,152 | 12/1989 | Hirata | 357/74 |
| 4,912,547 | 3/1990 | Bilowith et al. | 357/80 |
| 4,939,570 | 7/1990 | Bickford et al. | 357/74 |
| 4,941,033 | 7/1990 | Kishida | 357/74 |
| 4,953,005 | 8/1990 | Carlson et al. | 357/75 |
| 5,021,866 | 6/1991 | Sudo et al. | 357/80 |

FOREIGN PATENT DOCUMENTS 60-802305  5/1985  Japan ........................ 357/69

Primary Examiner—Rolf Hille
Assistant Examiner—S. V. Clark
Attorney, Agent, or Firm—Edward D. Manzo

[57] ABSTRACT

A semiconductor device comprising at least one semiconductor chip, the or each semiconductor chip having a plurality of chip bonding pads, a package which encloses the at least one semiconductor chip, a first level interconnect comprising a printed circuit which overlies the at least one semiconductor chip in the package and extends externaly of the package to provide a plurality of outer leads, and a second level interconnect comprising means for electrically connecting the chip bonding pads to selected contacts on the printed circuit, which contacts overlie the at least one semiconductor chip. The invention also relates to a method of manufacturing such a semiconductor device and to a method of assembling a semiconductor assembly.

11 Claims, 6 Drawing Sheets

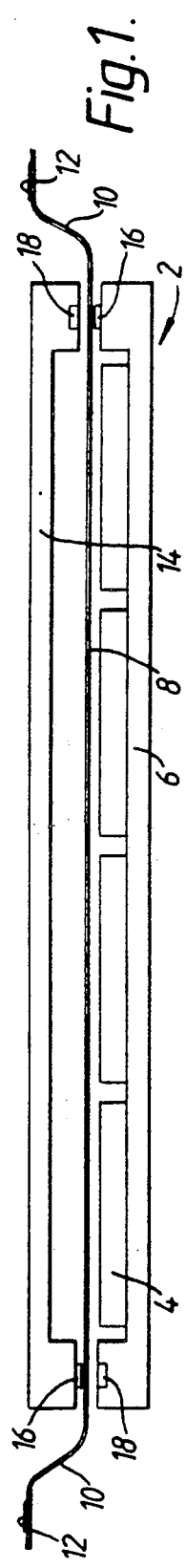
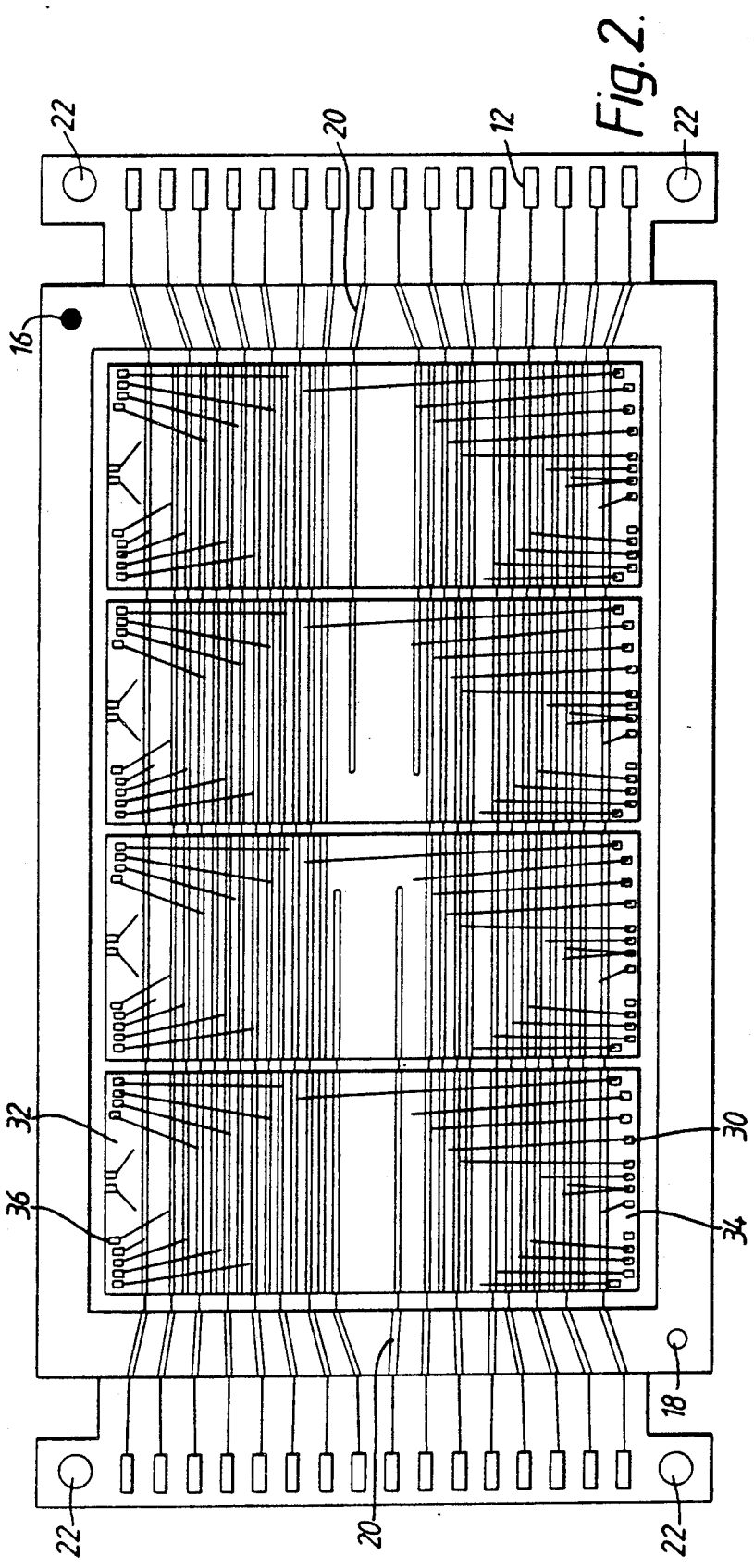

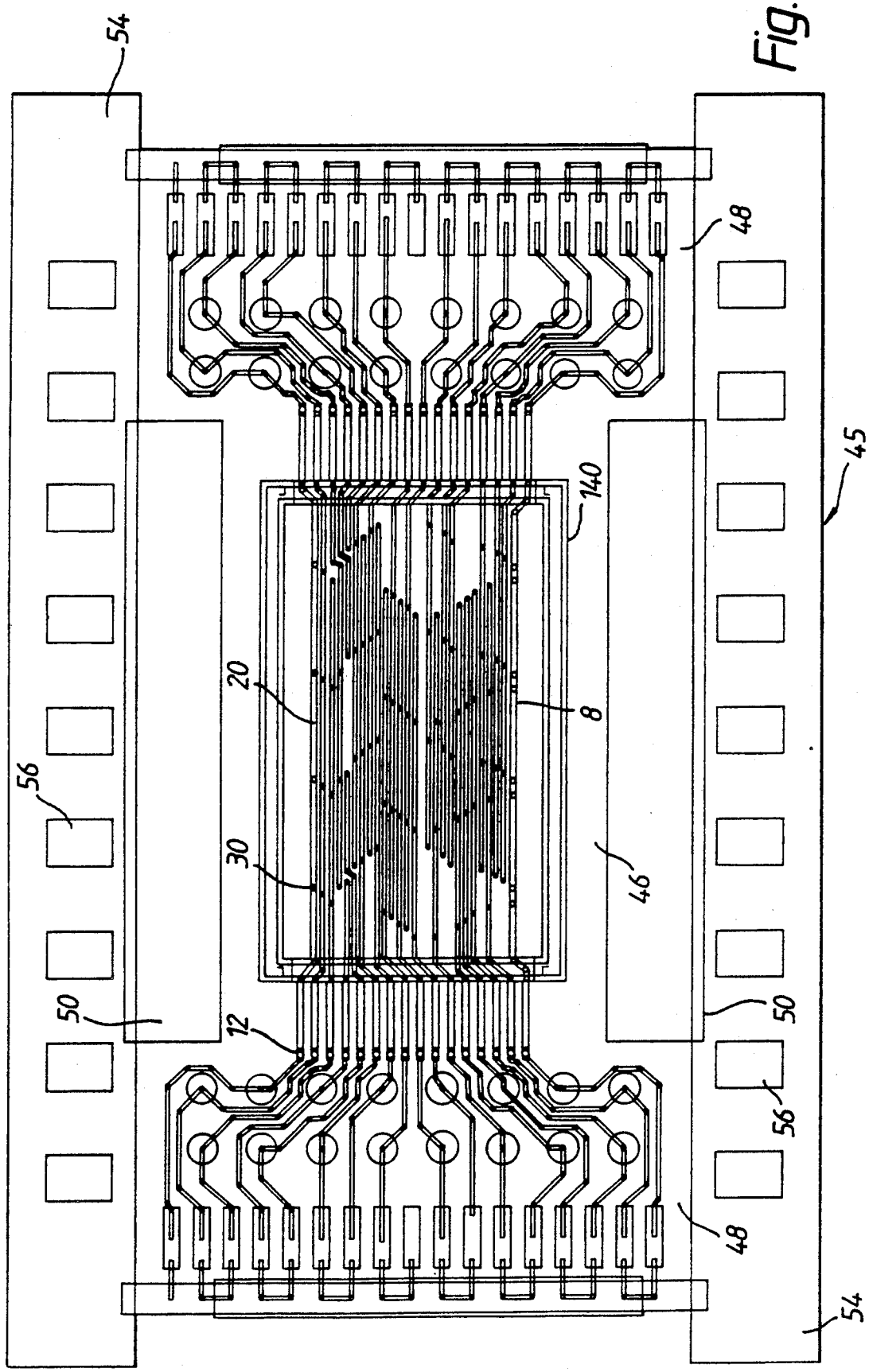

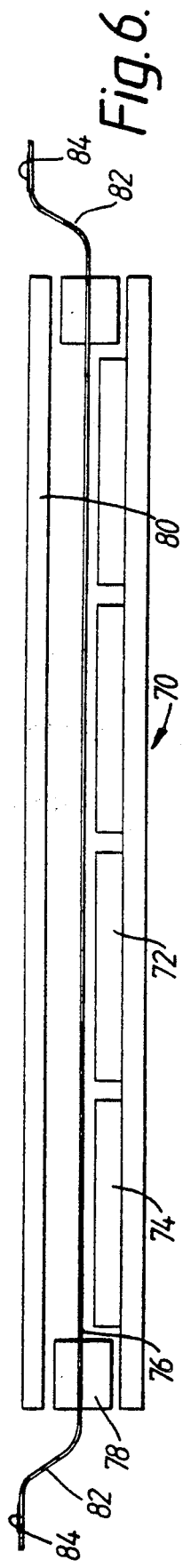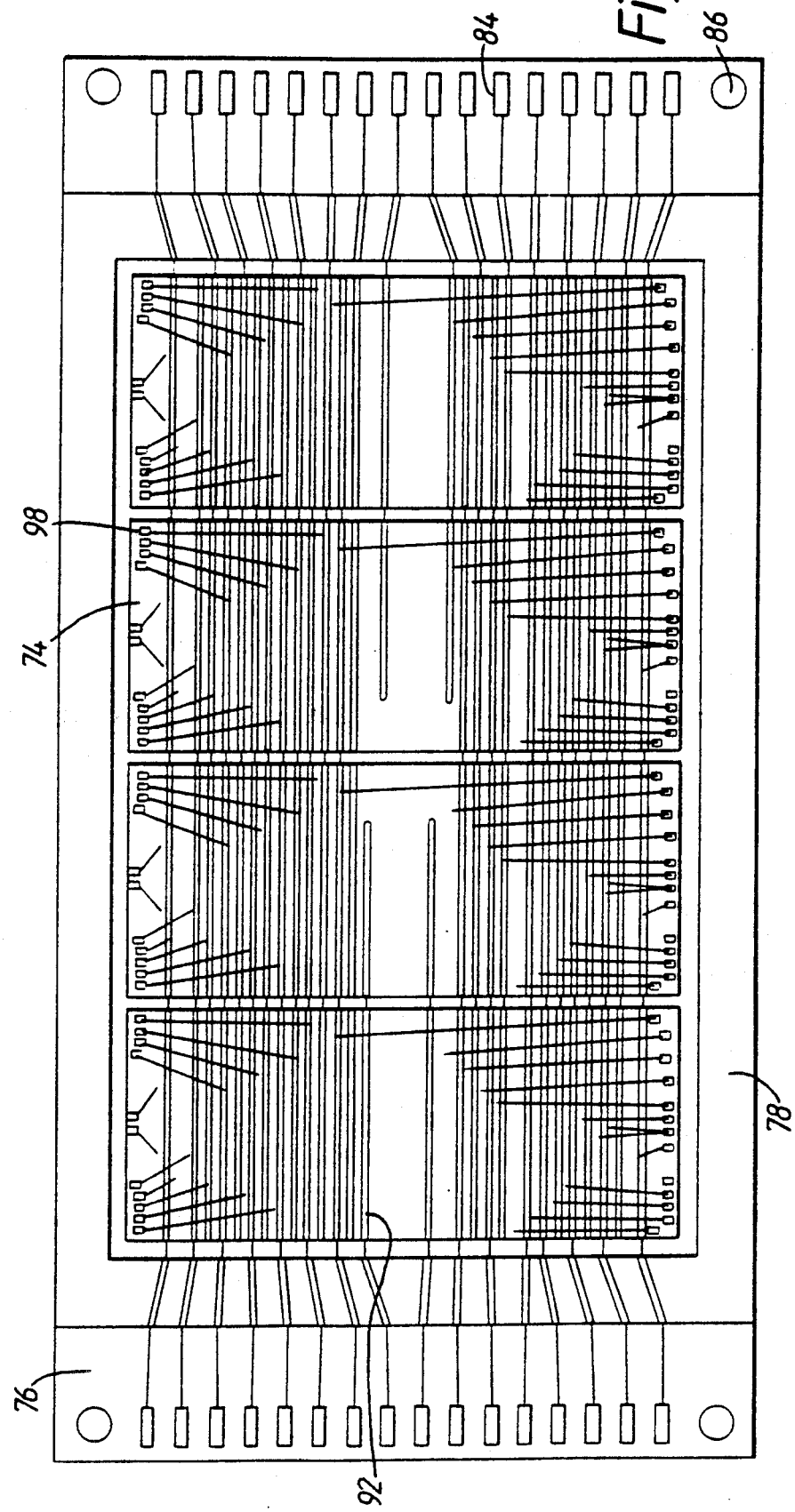

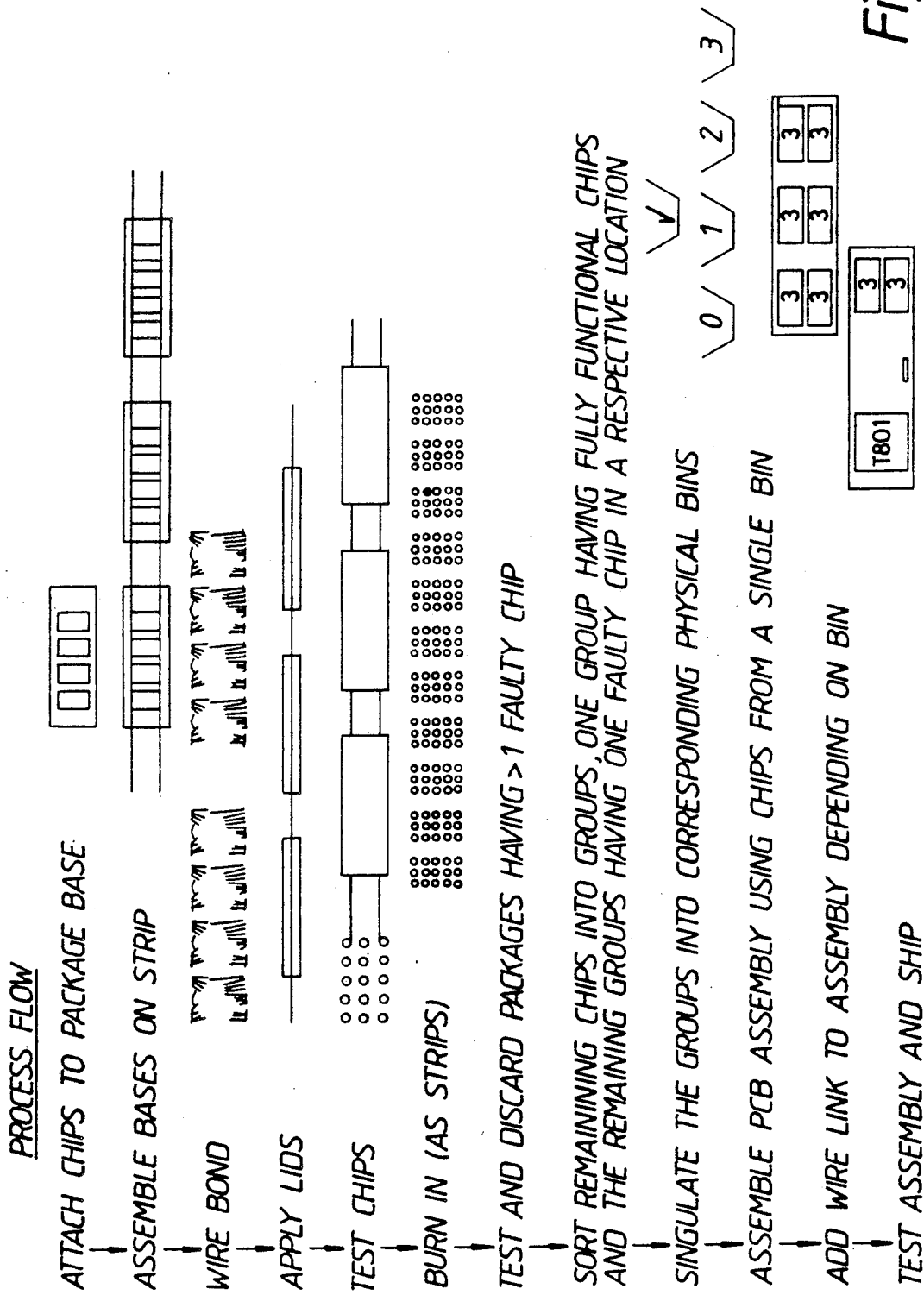

PACKAGING SEMICONDUCTOR CHIPS

BACKGROUND OF THE INVENTION

The present invention relates to a semiconductor device which includes a package enclosing at least one semiconductor chip, a method of manufacturing such a semiconductor device and a method of assembling a semiconductor assembly which includes a plurality of packages each comprising a plurality of semiconductor chips. In particular, the present invention relates to the packaging of multi-chip RAM assemblies.

In the semiconductor industry many advances are taking place in packaging different varieties of semiconductor components. Power components and components having high pin count are being provided with new packagings and to a lesser extent packagings for random access memories (RAMs) are also being developed. As RAMs constitute a large proportion of the electronics cost of a system, advances in packaging RAMs are very desirable. Generally, it is desired to build systems that are easy to build, easy to cool and have a high performance per unit volume. The applicant has already developed a microcomputer on a single chip (known as the "Transputer" - Transputer being a Registered Trade Mark of INMOS Limited) which attacks these problems by minimising the amount of "glue" logic needed to interface the processing chips to the memory and peripheral chips. This gives a substantial benefit in terms of processing power per unit volume. An effect of the improvement of this single chip microcomputer development is that the physical size and power consumption of the microcomputer system tends to be dominated by the amount of RAM used in the system. Typically, the microcomputer and glue logic take only 15% of the printed circuit board area, the remainder being taken by the RAM required by the system.

A number of known RAM packages exist. For example it is known to have dual-inline-packages (DIPs), zig-zag-packages (ZIP), surface mount packages (SOIC or SOJ) and the so-called "flip-chip" dies. Particular examples of such packages can achieve a packing density of silicon area over printed circuit board area of above 25%, the density normally achieved only with hybrid packaging techniques which mix thin or thick film and printed circuit technologies.

All of these known packages except for the flip-chip package suffer from the disadvantage that a large amount of area is required by the fan-out of the leads extending from the chips. In addition, RAMs tend to be rectangular chips, with bonding pads at the two ends thereof, whilst the packages tend to have leads along their sides and therefore considerable area is taken up in turning the leads through a right angle. In the flip-chip design, the fan-out from the chip bonding pads takes place within the area of the chip but the disadvantage of this package is that it is not surface-mount and so the package cannot be assembled on both sides of a printed circuit board. Even the existing surface-mount packages are not always ideal for mounting on both sides of a board because they have substantial thickness. The thickness is necessary partly to turn the leads under the body and also partly to give enough thickness of plastics material used for the package to give the package mechanical strength. A so-called "VSOP" single RAM chip has been produced by Mitsubishi which is very small, has short leads on a fine pitch at the ends of the package and is only 1 mm thick. However, the VSOP package is so small that many RAM chips are too large to fit into it. Also, it has such a small surface area that heat dissipation from the package is lower than for a larger Package, although a benefit from the thinness is that there is a very short thermal path between the chip and the outside surface of the package.

WO 88/02552 (General Electric Company) discloses a multichip integrated circuit packaging and method in which a polymer overlayer is laminated over the top of a row of semicondcutor chips carried on a substrate and then via openings are formed in the overlayer, which openings accommodate a layer of interconnection metallization which serves to connect various chips and chip pads within the interconnection pads disposed on the chips. The specification does not address the problem of accommodating the external leads of a package to reduce package size.

EP 0178227 (Fujitsu Limited) discloses an integrated circuit semiconductor device formed on a wafer. The specification also does not address the problem of accommodating the external leads of a package to reduce package size.

U.S. Pat. No. 4283839 (Westen Electric Co., Inc.) discloses a method of bonding semiconductor devices to carrier tapes in which a carrier tape has a pattern of lead clusters which are bonded to a chip. The specification does not specifically relate to semiconductor packages.

GB 1530216 (National Semiconductor Corporation) discloses thermal compression gang bonding of interconnect leads to semiconductive devices and terminal structures. GB 1529518 (National Semiconductor Corporation) discloses antioxidant coating of copper parts in thermal compression gang bonding of semicondcutor devices. Neither specification addresses the problem of reducing package size.

The present invention aims at least partially to alleviate the above-specified problems of the prior art and aims to provide a package which takes less volume than the known packages and preferably can also provide improved heat dissipation when compared to the prior art.

SUMMARY OF THE INVENTION

Accordingly, the present invention provides a semiconductor device comprising at least one semiconductor chip, the or each semiconductor chip having a plurality of chip bonding pads, a package which encloses the at least one semiconductor chip, a first level interconnect comprising a printed circuit which overlies the at least one semiconductor chip in the package and extends externally of the package to provide a plurality of outer leads, and a second level interconnect comprising means for electrically connecting the chip bonding pads to selected contacts on the printed circuit, which contacts overlie the at least one semiconductor chip.

Preferably, the said electrical connection means is disposed within the area of the at least one chip in the package.

In a particularly preferred embodiment of the invention, the semiconductor device comprises a plurality of random access memory chips. However, the present invention is not limited to the packaging of memory chips.

The present invention further provides a method of manufacturing a semiconductor device, the method comprising the steps of:
- (a) disposing a first level interconnect comprising a printed circuit over at least one semiconductor chip having a plurality of chip bonding pads;
- (b) forming a second level interconnect by electrically connecting the chip bonding pads to selected contacts on the printed circuit, which contacts overlie the at least one semiconductor chip; and
- (c) enclosing the at least one semiconductor chip within a package, the printed circuit having a plurality of outer leads which are located externally of the package.

The present invention further provides a method of assembling a semiconductor assembly which includes a plurality of packages, each package comprising a plurality of semiconductor chips, the method comprising the steps of:
- (a) testing the packages to determine which semiconductor chips in each package are functional;
- (b) sorting the packages into N+1 functional groups, where N is the number of semiconductor chips in each package, one group comprising packages which are fully functional and each of the remaining groups comprising packages having a non-functional semiconductor chip at a respective known position;
- (c) selecting from at least one group a plurality of the packages for the semiconductor assembly, the selection being carried out whereby for each selected package, the group thereof is correlated with the particular assembly; and
- (d) assembling the semiconductor assembly in response to the at least one group of the selected packages.

BRIEF DESCRIPTION OF THE DRAWINGS

Embodiments of the present invention will now be described by way of example only with reference to the accompanying drawings, in which:

FIG. 1 is a schematic partly-exploded cross-section through a semiconductor chip package in accordance with a first embodiment of the present invention;

FIG. 2 is a schematic plan of part of the semiconductor chip package of FIG. 1;

FIG. 5 schematically illustrates a portion of a strip of flexible circuit which is to form the printed circuit shown in FIGS. 1 to 4;

FIG. 6 is a schematic partly-exploded cross-section through a semiconductor chip package in accordance with a second embodiment of the present invention;

FIG. 7 is a schematic plan of part of the semiconductor chip package of FIG. 6;

FIG. 10 is a process flow for a method of assembling semiconductor assemblies in accordance with a further aspect of the present invention.

DETAILED DESCRIPTION OF THE PREFERRED EMBODIMENTS

Figure 3:
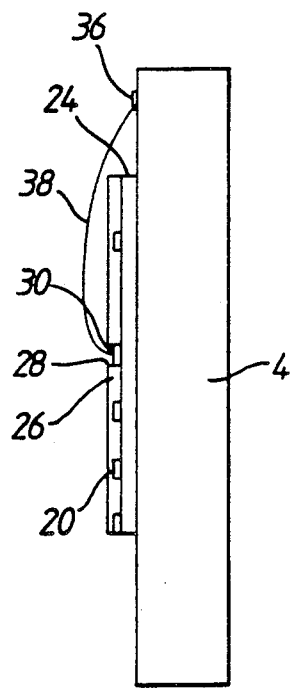
FIG. 3 schematically illustrates the electrical connections between a semiconductor chip and the printed circuit of the package of FIGS. 1 and 2.

Referring to FIG. 1, there is shown a semiconductor chip package 2 in accordance with a first embodiment of the present invention. The semiconductor chip package 2 comprises a row of four RAM chips 4. The underside of each chip 4 is adhered to a thermally conductive sheet 6 which constitutes the base of the package 2. Typically, the base 6 is composed of metal. A thin printed circuit 8 overlies the four RAM chips 4. In this specification, the term "printed circuit" is intended to mean a plurality of electroconductive tracks carried on an insulating material. In this embodiment the printed circuit 8 is flexible and comprises an electroconductive layer of circuitry, e.g. an array of copper tracks 20, sandwiched between two layers of insulating material, e.g. of polyimide or epoxy. At opposed ends 10 of the flexible printed circuit 8 are provided outer leads 12 for connection to a printed circuit board (not shown) on which the package is to be mounted, the outer leads 12 being formed by exposure of the electroconductive tracks 20 in the flexible printed circuit 8. A lid 14 overlies the flexible printed circuit 8 and has the same dimensions as the base 6. The base 6 and lid 14 have peripheral flanges which are provided with complementary registration pegs and holes 16, 18 which enable the base and lid 6, 14 accurately to be located in registry with each other thereby to form a sealed package 2. The base 6 and lid 14 are adhered together e.g. by a silicone adhesive along their peripheral mating surfaces so as to seal the package. The inner volume of the package 2 may include a material (not shown) which covers the electrical connections in the package and provides protection from moisture penetration of the chips. Such a material may be, for example a conventional moulding material, a "glob top" epoxy as used in known hybrid packages or a self-healing gel contained by a non-hermetic enclosure.

Figure 4:
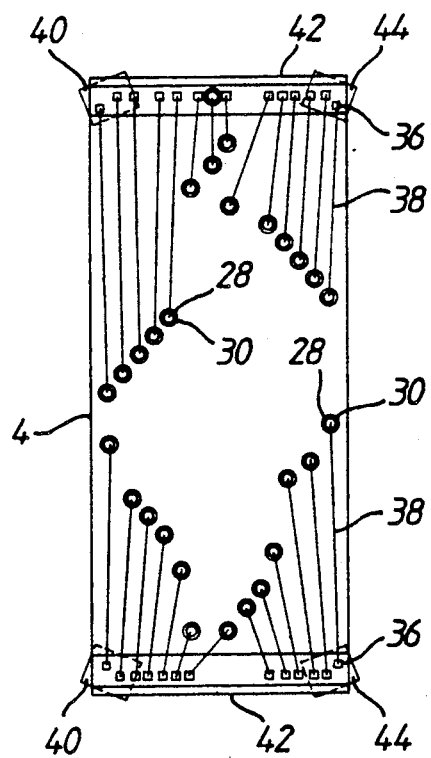
FIG. 4 schematically illustrates in greater detail the relationship between the electrical connections, the semiconductor chip and the printed circuit shown in FIG. 3.

FIGS. 2 to 4 illustrate how the chips 4 are electrically connected to the flexible printed circuit 8. The flexible printed circuit 8 comprises an array of electroconductive tracks 20, each of which extends transverse to one or more of the chips 4 and in a direction extending between the opposed outer leads 12. Each track 20 is connected, depending upon its function, either to a single respective outer lead 12 at a respective end of the package 2 or to a pair of opposed respective outer leads 12 at respective ends of the package 2. The tracks 20 are parallel in that portion of the flexible circuit 8 which overlies the row of chips 4 and the tracks 20 diverge at the opposed ends of the flexible circuit 8 so as to be able to connect to a respective outer lead 12. A row of sixteen outer leads 12 is provided at each end 10 of the flexible printed circuit 8. In an alternative embodiment, a row of twenty outer leads is provided at each end of the printed circuit. Each end 10 of the flexible printed circuit 8 is also provided with registration holes 22 to enable the outer leads 12 accurately to be registered onto respective contacts on a printed circuit board (not shown). The flexible circuit 8 as described above comprises the electroconductive tracks 20 which are sandwiched between a lower insulating layer 24 which is between the tracks 20 and the chips 4 and an upper insulating layer 26 which covers the tracks 20. The upper insulating layer 26 is provided with a number of openings 28 each of which exposes a respective bonding pad 30. The ends 32, 34 of each chip 4 are each provided, in known manner, with a row of chip bonding pads 36. Each chip bonding pad 36 is connected to a respective bonding pad 30 on the flexible circuit by a wire 38 which is bonded at its opposed ends to the two bonding pads 36, 30. The bond wires 38 comprise a second level of interconnect which is located above the first level of interconnect constituted by the flexible printed circuit. It will be seen that the interconnections are such that no bond wire 38 overlies any other bond wire 38 so as to avoid any short circuit from being made. In addition, since the tracks 20 are covered by the upper insulating layer 26 of the flexible printed circuit 8, there is no possibility of any bond wire 38 short circuiting by inadvertent contact with a track 20. In the illustrated arrangement, the width of the flexible printed circuit 8 is greater than the length of each chip 4, in order to provide sufficient mechanical strength for the flexible printed circuit. Accordingly, as shown in FIG. 4, three partially-overlapping rectangular holes 40, 42, 44 are cut in the insulating layers 24, 26 of the flexible circuit 8 at a location overlying each row of chip bonding pads 36. This enables the bond wires 38 to extend upwardly through the holes 40, 42, 44 from the chip bonding pads 36 thereby to extend over the upper surface of the flexible printed circuit 8 and connect with the respective bonding pads 30. In alternative arrangements, there may be provided a group of spaced holes or slots overlying the chip bonding pads. This gives a mechanically more stable flexible printed circuit. In addition, such spaced holes are required when the invention is employed to package an integrated circuit having chip bonding pads on all four of its sides.

FIG. 5 shows schematically the layout of a portion of an elongate strip 45 including the thin flexible printed circuit 8 prior to connection to the chips 4. For clarity of illustration, any holes which are cut in the thin printed circuit are not shown. However, the printed circuit may be provided with registration holes to allow registration of the thin printed circuit relative to the base of the package. The strip consists of a central region 46 comprising the tracks 20 and the bonding pads 30. The strip 45 also includes the outer leads 12 at opposed ends of the central region 46. Connected to the outer leads 12 at opposed ends of the portion of the strip 45 are opposed regions of test circuitry 48 which are employed, when the flexible printed circuit 8 has been connected to the chips 4 by the bond wires 38, to test the operation of the packaged semiconductor device. The central region 46 also includes opposed, longitudinally directed regions 50 of copper which act mechanically to support the central region 46. The central and test regions 46, 48 are bounded on opposed transverse sides by lateral supporting regions 54 which are provided with rows of tractor feed holes 56 which enable the flexible printed circuit 8 to be fed along a production line in a continuous manufacturing process. Typically, there is provided an elongate strip having a row of the flexible printed circuits 8 therealong. A preferred manufacturing process will be described hereinafter. After the chips 4 have been packaged and tested, the test regions 48 and the lateral supporting regions 54 of the strip are removed so that the final flexible printed circuit 8 is as shown in FIG. 2.

Figure 8:
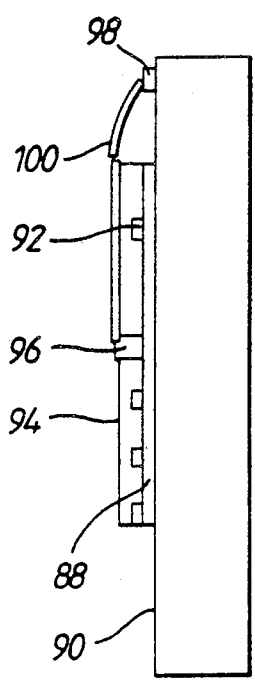
FIG. 8 schematically illustrates the electrical connections between a semiconductor chip and the double-sided printed circuit of the package of FIGS. 6 and 7.

FIGS. 6 to 8 illustrate a semiconductor chip package in accordance with a second embodiment of the present invention. A semiconductor package 70 consists of a base 72 e.g. of metal to which is adhered a row of semiconductor chips 74. In the illustrated embodiment, there is a row of four RAM chips 74. A flexible printed circuit 76 overlies the row of chips 74. The flexible printed circuit 76 is carried by a rectangular supporting member 78 which, in the package 70, constitutes a peripheral side wall of the package 70. A lid 80 overlies the side wall 78 and the base 72. The base 72 and the lid 80 are sealingly adhered to the side wall 78 thereby to seal the chips 74 inside the package 70. A material (not shown) for protecting the chips from moisture may be incorporated in the package 70. The thin flexible printed circuit 76 extends outwardly away from opposing longitudinal ends of the package 70 and is provided at opposing ends 82 thereof with a row of upwardly directed outer leads 84. The ends 82 of flexible printed circuit 76 are also provided with registration holes 86 to enable the package 70 to be accurately mounted on a printed circuit board (not shown). In this embodiment, the flexible printed circuit 76 has a different construction from that of the first embodiment and also a different means is employed to connect electrically the chip bonding pads to the flexible printed circuit 76. As is shown in FIGS. 7 and 8, the flexible printed circuit 76 employs a multi-layer tape. The flexible printed circuit 76 comprises a lower insulating layer 88 which is disposed against the upper surface 90 of the chips 74. A parallel array of electroconductive tracks 92 e.g. of copper is disposed on the lower insulating layer 88. The tracks 92 are similar to the tracks 20 of the first embodiment and are connected to respective outer leads 84 at the ends 82 of the flexible printed circuit 76. An upper insulating layer 94 covers the tracks 92. At selected locations, each track 92 is provided with an upstanding via 96 which extends through the upper insulating layer 94. Each via 96 is connected to a respective chip bonding pad 98 by a tape-automated-bonding (TAB) inner lead 100 which extends from the respective via 96 over the upper insulating layer 94 and the TAB inner lead 100 is bonded to the chip bonding pad 98. It will be understood that the insulated layers 88, 94 of the flexible printed circuit 76 are provided with holes in registry with the chip bonding pads 98, the holes being similar to the holes 40, 42, 44 provided in the first embodiment. FIG. 7 shows schematically the connections made between the tracks 92 and the chip bonding pads 98 although it will of course be understood that the TAB inner leads do not require the thin wire-like connectors shown schematically in FIG. 7 but rather they consist of narrow strips so as to have sufficient mechanical strength at the ends thereof which are to be bonded to the chip bond pads 98. As is clear from FIG. 7, the insulating material 88, 94 of the flexible printed circuit 76 extends fully across the width of the package so as to provide increased mechanical strength for the flexible printed circuit 76.

Figure 9:
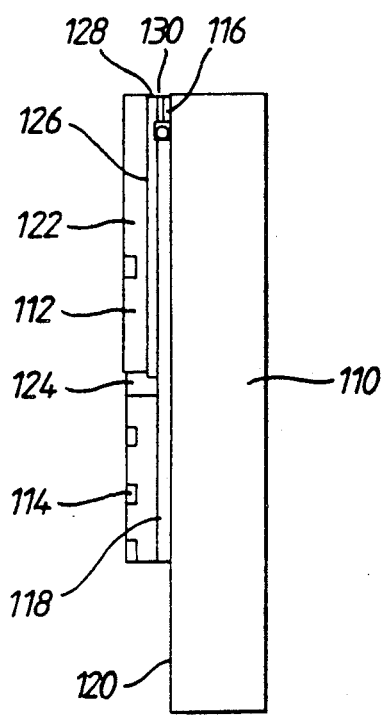
FIG. 9 schematically illustrates electrical connections between a semiconductor chip and a double-sided printed circuit of a package in accordance with a third embodiment of the present invention.

A third embodiment of a semiconductor chip package in accordance with the present invention will now be described with reference to FIG. 9. FIG. 9 is similar to FIG. 8 in showing a schematic side view of a chip 110 carrying thereon a flexible printed circuit 112 having electroconductive tracks 114 which are electrically connected to chip bonding pads 116. The flexible printed circuit 112 is mounted in the package in the same manner as shown in FIG. 6. The flexible printed circuit 112 has bonding pads and registration holes (not shown) at respective ends of the flexible printed circuit 112 in a manner similar to those of the second embodiment shown in FIG. 7. The flexible printed circuit 112 consists of a lower insulating layer 118 which is disposed against the upper surface of the chip 110. An upper insulating layer 122 extends over the lower insulating layer 118 and carries in its upper surface a series of longitudinal extending parallel tracks 114 of electroconductive material such as copper. At selected locations on the tracks 114, a via 124 is provided which extends downwardly through the upper insulating layer 122. The via 124 is connected to an end of a transversely-directed electroconductive connector 126 which extends as far as a respective longitudinal edge of the flexible printed circuit 112. The free end 128 of the connector 126 has provided thereon a solder bump 130 which is soldered to a respective chip bonding pad 116. The upper insulating layer 122 transversely overlaps the lower insulating layer 118 so as to provide a mechanical support for the end 128 of the connector 126 and the solder bump 130 above the respective chip bonding pad 116. The arrangement shown in FIG. 9 is designated a "flip-chip" arrangement.

For the avoidance of doubt, it should be understood that the construction of the base and lid, as exemplified in FIGS. 1 and 6, is not directly dependent upon the construction of the printed circuit and the electrical connections between the printed circuit and the chips, as exemplified in FIGS. 3, 8 and 9. Thus, the base/lid assembly of FIG. 1 could be optionally employed in the second and third embodiments and the base/lid assembly of FIG. 6 could optionally be employed in the first and third embodiments.

In each of the foregoing embodiments, the flexible printed circuit may be provided with additional electroconductive and insulating layers thereby to provide a plane for power and ground which extends over the row of chips. The ground plane acts both to shield the RAMs from any noise generated by the signals across the thin printed circuit and to provide a low inductance path for the logic reference and supply voltages. In FIG. 5, the ground plane outline of the flexible printed circuit is indicated by reference numeral 140. If desired, in the first embodiment the bond wires may be arranged so as to allow decoupling capacitors within the package as disclosed in U.S. Pat. No. 4744008.

In each of the three illustrated embodiments, the underside of each of the chips is adhered to a thermally conductive sheet constituting the base of the package. The sheet spreads the heat out between the chips so that all the chips are within a few degrees of the same temperature. The sheet also provides and exceptionally short thermal path to the external surface of the package. Particular preferred materials for the thermally conductive sheet are metals which also give excellent mechanical strength, thereby providing a mechanically sound package which is thinner than would be possible using standard package plastics. Typically, the base of the package may be made of aluminium having a thickness of around 0.038 cm. The thermally conductive sheet constituting the base is actually treated as the top of the package when the package is assembled onto a printed circuit board. As has been described above, the outer leads on the flexible printed circuit are connected to a printed circuit board and this results in the base of the package, to which the chips are adhered, being located on the side of the package which is remote from the printed circuit board. This further exploits the short thermal path from the chips to the external surface of the package since that surface is directly in contact with air and is able to irradiate heat to adjacent cooler surfaces. Radiation may be assisted, as is conventional with heat sinks, by black anodizing or painting the thermally conductive sheet and by giving the sheet a larger surface area, for example by adding fins to the sheet. This orientation of the package also puts the outer leads of the thin printed circuit in the right orientation so that they can be soldered to the printed circuit board without removing the insulating laminate of the thin printed circuit. This keeps the package leads in exact registration with respect to each other and overcomes the problems of the fragility of conventional package leads. Furthermore, since a number of chips are assembled in a single package, this means that the package is large enough to dissipate the heat generated by the chips. Normally, the circuitry would be arranged so that only one or two of the chips in the package is or are active at any given time, thus providing that for the one or two active chips, an effective heat sink capability of four chips is available.

It is difficult to quantify the improvement in the thermal characteristics of the packages in accordance with the present invention compared to the prior art. However, it is believed that there is a substantial improvement in the temperature differential between the chips and the ambient cooling air. A possibly more significant effect comes from the heat spreading: if one of the RAMs is accessed at a 100% duty cycle, and the others are in standby, the temperature of the RAM that is being continuously accessed will be approximately the same as a singly packaged RAM would be when running at a 25% duty cycle, because the heat is spread out over the four RAM chips. A small reduction in chip temperature can make a large improvement in the reliability of the chip, since higher operating temperatures result in reduced chip lifetimes, so that the package of the present invention can provide improved reliability of the RAM. The thermal improvements can also give cost and/or performance benefits because MOS circuits become slower and have higher leakage currents at increasing temperatures. Accordingly, since the packages of the present invention can provide improved heat sink capabilities, the performance of the RAM is improved compared to the prior art.

In the packages of the present invention, the chips are connected to each other and to external leads by a thin printed circuit which lies over the active circuitry on the chip. This drastically reduces the number of leads needed to connect the package to the printed circuit board when the package is assembled thereon. For example, in the prior art 96 leads would be required by an assembly of four RAMs consisting of four separate 24 lead packages whereas in the present invention a single package containing four RAMs would require only 32 leads. In addition, the reduction in the number of leads provides a gain in reliability when compared to the prior art since a reduced number of soldered joints on the board is employed using the multi-chip RAM packages of the present invention.

In each of the illustrated embodiments, mechanical tooling holes are provided adjacent the package leads so that the precise registration of the leads of the package can be extended to register with the printed circuit board without the need for pattern recognition equipment, although this could be employed if appropriate. If the insulating laminate of the thin printed circuit is removed to give unsupported leads, the tooling holes can be put into copper, thereby in effect making wide leads which are particularly appropriate for power and ground terminals.

Furthermore, the packages of the present invention give great advantage over the prior art constructions in reducing the package size. In the illustrated embodiments, it will be seen that the four RAMs can be closely assembled together in the package and since the flexible printed circuit overlies the RAMs, this greatly reduces the overall size of the package. In the embodiment illustrated in FIGS. 1 and 2 for example, the package consists of four 64K×4 static RAMs assembled to make 256K×4 of static RAM in a package having the dimensions 2.64 cm×1.30 cm×0.19 cm. The smallest standard known package for the 64K×4 RAM is the so-called SOJ surface mount package which has the dimensions 1.54 cm×0.86 cm×0.33 cm, four of which would occupy a printed circuit area (allowing for minimal gaps between components) of 3.18 cm×1.84 cm. Thus the package in accordance with the invention gives an area improvement of about 1.7 times compared to such a known package. This improvement in area is achieved in spite of using a so-called "gull wing" style of lead, (i.e. the leads extend away from the ends of the package and are bent down towards the level of the PCB and are not folded back beneath the package). The "gull wing" style of lead employed in the present invention gives a solder joint which is much more easily inspected than the SOJ package. The reduction in height achieved by the present invention is also an improvement of about 1.7 times over the prior art, thereby giving a volumetric improvement of the package of the present invention when compared to the prior art of about three times. More significant is a reduction in height to below the 0.254 cm height of conventional solder joints on the solder side of the printed circuit board, allowing the packages of the present invention to be assembled onto the solder side of almost any printed circuit board. A further benefit from the height reduction is that a memory board 0.127 cm thick, with the RAM packages of the present invention on both sides, becomes just 0.508 cm thick, which is the height of standard dual-in line packages (DIP's).

The second illustrated embodiment employs flexible circuit tape such as is used for tape automated bonding (TAB). The package in accordance with the present invention can make more effective use of the area of the flexible circuit tape than in the TAB process of the prior art since the TAB tape overlies the chips. If the TAB tape is used in accordance with the present invention, the packages can be made by a continuous flow assembly, employing static burn-in and testing, with consequential benefits in reduced costs of the finished products. This is discussed further below.

It should be understood that although the three illustrated embodiments employ a plurality of semiconductor memory chips in the packages of the present invention, the packages of the present invention can be employed to package any type of integrated circuit either singly or multiply wherein a number of integrated circuits are packaged in a single package.

The three illustrated embodiments respectively employ bonding wires, tape-automated-bonding (TAB) tape and flip-chip connectors and solder blobs to form a second level of interconnect which is separated from the first level of interconnect, constituted by the tracks of the printed circuit on an insulating layer, by an insulating layer. The use of conventional bonding wires reduces the cost of the semiconductor package. However, it is also possible to use a single layer circuit and a second layer can be added for power and ground without the need for plated through holes. Such plated through holes, if used to connect to tracks acting in place of the bond wires, would need to be on a pitch of about 0.02 cm, which, while possible, is not inexpensive.

The packages of the present invention therefore offer a number of benefits in costs, performance and reliability compared to those of the prior art, both at the level of a single RAM package and at the level of a system which is assembled from single- or multi-chip packages and other components.

In accordance with a further aspect of the present invention, there is provided a process for manufacturing multi-chip semiconductor assemblies. It is known that in the manufacture of semiconductor chips, statistically only a certain percentage of chips will be fully functional after manufacture. When more than one chip is assembled in a package, the statistical chances of the package containing one or more faulty chips are greatly increased. Accordingly, an effect of using more than one chip in a package is that the yield of fully functional final assemblies may suffer as a result of one of the chips failing before the final test. The present invention provides a process for assembling multi-chip packages which not only enables manufacture of fully functional assemblies but also enables manufacture of partly functional assemblies which nevertheless have commercial value. FIG. 10 shows a process flow in accordance with a further embodiment of the present invention, the process flow relating to the manufacture of microprocessor assemblies which comprise, mounted on a printed circuit board, a single chip microcomputer (e.g. a "Transputer" microcomputer, Transputer being a Registered Trade Mark of INMOS Limited), eight packages of 256K×4 RAM, the packages being such as those illustrated in FIGS. 1 to 9, and a semiconductor chip comprising a programmable logic array by means of which the single chip microprocessor accesses the RAMs.

In accordance with the process, the individual RAM chips are attached to a package base and then the package bases having the required number of chips (e.g. four) attached thereto are assembled in a line on a strip of flexible printed circuit such as that shown in FIG. 5. The chips are then wire bonded to the flexible printed circuit so as to provide connections such as those shown in FIG. 2. The package lids are then applied over the package bases and adhered thereto. The multi-chip packages may then be tested by making appropriate connections to the test circuitry of the strips and then the strips are subject to a burn-in wherein the strips are heated up so as to induce an infant mortality whereby those chips which would be likely to fail e.g. in the first year of use do so during the burn in process and are thereby discarded and removed from the system. The individual packages may then be tested.

In accordance with the manufacturing process of the present invention, the output from the test is sorted into the N+1 functional groups, where N is the number of chips assembled in each package. One of the groups takes fully functional assemblies i.e. each of the chips in the package is fully functional, N groups take assemblies with a single faulty chip in each of the N possible places for a chip to fail, and the remaining assemblies with more than one faulty chip are discarded. Preferably, each group is singulated into a respective physical bin. Subsequently, the printed circuit board assembly is assembled by selecting packages from pre-selected bins and the assembly of the printed circuit board with the components thereon has optional links or programmable decoders which are assembled according to which group or groups are used to build the particular printed circuit board assembly. For example, the programmable logic array can have five different programs for the logic depending on which group or groups are selected. In one particular illustrative arrangement, the printed circuit board assembly may employ packages from a single group which only include packages having the third RAM of the package being faulty. Since the packages used are all identical and are uniformly faulty in a known way, the circuitry or programmable logic array of the printed circuit board can be reliably preselected in response to the known fault of the packages. The assembled printed circuit board would then be finally tested and shipped.

The present invention thus provides a process flow which permits partly faulty packages conveniently to be employed in the manufacture of a printed circuit board assembly. This can greatly increase the usability of the manufacture of packages and accordingly reduces manufacturing costs.

What we claim is:

1. A semiconductor device comprising at least one semiconductor chip, the or each semiconductor chip having a plurality of chip bonding pads, a package which encloses the at least one semiconductor chip, a first level interconnect comprising a printed circuit which overlies the at least one semiconductor chip in the package and extends externally of the package to provide a plurality of outer leads, and a second level interconnect comprising means for electrically connecting the chip bonding pads to selected contacts on the printed circuit, which contacts overlie the at least one semiconductor chip.

2. A semiconductor device according to claim 1 wherein the said electrical connection means is disposed within the area of the at least one semiconductor chip in the package.

3. A semiconductor device according to claim 1 wherein the said at least one semiconductor chip comprises a plurality of random access memories (RAMs).

4. A semiconductor device according to claim 1 wherein the printed circuit is flexible.

5. A semiconductor device according to claim 1 wherein the printed circuit comprises a plurality of electroconductive tracks extending between opposed rows of outer leads on respective opposed ends of the printed circuit, the electroconductive tracks being supported on a layer of insulating material.

6. A semiconductor device according to claim 5 wherein the electroconductive tracks are disposed between two layers of insulating material.

7. A semiconductor device according to claim 6 wherein that one of the said two layers of insulating material which is remote from the or each semiconductor chip has holes therein which reveal the said contacts which comprise bonding pads of the electroconductive tracks, and the said electrical connection means comprises a plurality of bonding wires each of which connects a respective bonding pad to a respective chip bonding pad.

8. A semiconductor device according to claim 6 wherein the contacts are comprised of a plurality of electroconductive vias of the electroconductive tracks which vias extend through that one of the said two layers of insulating material which is remote from the or each semiconductor chip, and the said electrical connection means comprises an array of electroconductive fingers each of which connects a respective via to a respective chip bonding pad.

9. A semiconductor device according to claim 8 wherein the electroconductive fingers are formed in a tape automated bonding (TAB) process.

10. A semiconductor device according to claim 5 wherein the printed circuit further comprises a second layer of insulating material which is disposed adjacent the or each semiconductor chip, the first-mentioned layer of insulating material being located over the said second layer of insulating material and the electroconductive tracks being disposed on the side of the first-mentioned layer of insulating material which is remote from the or reach chip, the contacts being comprised of a plurality of electroconductive vias of the electroconductive tracks, which vias extend through the first-mentioned layer as far as the second layer, and the said electrical connection means comprising a plurality of connectors which are disposed between the said two layers and each connect a respective via to a respective chip bonding pad.

11. A semiconductor device according to claim 1 wherein each connector carries a solder bump by means of which it is connected to the respective chip bonding pad.

* * * * *